(12) United States Patent
Sha et al.

(10) Patent No.: US 6,553,057 B1
(45) Date of Patent: Apr. 22, 2003

(54) CIRCUIT AND METHOD FOR LINEAR CONTROL OF A SPREAD SPECTRUM TRANSITION

(75) Inventors: I-Teh Sha, Santa Clara, CA (US); Albert Chen, Saratoga, CA (US); Kuang-Yu Chen, Saratoga, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/436,155

(22) Filed: Nov. 9, 1999

(51) Int. Cl.$^7$ .............................. H04B 1/69; H03D 3/24; H03L 7/06
(52) U.S. Cl. ..................... 375/130; 375/376; 327/157
(58) Field of Search .................. 327/148–157; 331/17–34, 1; 375/130–376

(56) References Cited

U.S. PATENT DOCUMENTS

| | | | |
|---|---|---|---|
| 4,578,649 A | 3/1986 | Shupe ........................ | 331/78 |
| 5,148,447 A | 9/1992 | Ito ................................ | 375/7 |
| 5,204,877 A | 4/1993 | Endo et al. ..................... | 375/1 |
| 5,226,058 A | 7/1993 | Anderson et al. ............. | 375/1 |
| 5,416,434 A | 5/1995 | Kootstra et al. ............. | 327/113 |
| 5,488,627 A | 1/1996 | Hardin et al. ................. | 375/204 |
| 5,491,458 A | 2/1996 | McCune, Jr. et al. ........ | 332/144 |
| 5,610,955 A * | 3/1997 | Bland ........................... | 327/156 |
| 5,631,920 A * | 5/1997 | Hardin ......................... | 219/702 |
| 5,872,807 A * | 2/1999 | Booth et al. ................. | 375/200 |
| 6,292,507 B1 * | 9/2001 | Hardin et al. ................ | 327/148 |
| 6,377,646 B1 * | 4/2002 | Sha .............................. | 327/157 |

FOREIGN PATENT DOCUMENTS

| | | |
|---|---|---|
| EP | 0655829 | 5/1995 |
| EP | 0739089 | 10/1996 |

OTHER PUBLICATIONS

Circuit and Method for Controlling a Spread Spectrum Transition, U.S. Ser. No. 09/436,522, filed Nov. 9, 1999.

* cited by examiner

*Primary Examiner*—Stephen Chin
*Assistant Examiner*—Lawrence Williams
(74) *Attorney, Agent, or Firm*—Christopher P. Maiorana, P.C.

(57) ABSTRACT

A spread spectrum clock generator comprising a spread spectrum modulation circuit and a control circuit. The spread spectrum modulation circuit may be configured to generate a clock signal in response to (i) a sequence of linearity ROM codes, (ii) a sequence of spread spectrum ROM codes, and (iii) a command signal. The control circuit may be configured to synchronize the command signal to a feedback signal. The sequence of linearity ROM codes and the sequence of spread spectrum ROM codes may be generated by predetermined mathematical formulas and optimized in accordance with predetermined criteria.

20 Claims, 7 Drawing Sheets f(t) : PLL's RUNNING FREQUENCY IN TRANSIENT PERIOD $f_{off}$ : PLL's SSCG OFF FREQUENCY $f_{max}$ : MAXIMUM FREQUENCY IN SSCG ON $f_{min}$ : MINIMUM FREQUENCY IN SSCG ON f : PEAK TO PEAK FREQUENCY IN SSCG

TWO CRITERIA NEED TO BE SATISFIED (i) FREQUENCY RUNNING RANGE $(f_{min} - 0.5 \Delta f) \le f(t) \le f_{off}$ (ii) SLEW RATE IS BELOW THAN 60kHz/uS   $|df(t)/dt| \le 60kHz/uS$

CIRCUIT AND METHOD FOR LINEAR CONTROL OF A SPREAD SPECTRUM TRANSITION

CROSS-REFERENCE TO RELATED APPLICATIONS

The present invention may relate to co-pending application Ser. No. 09/436,522, filed concurrently, which is hereby incorporated by reference in its entirety.

FIELD OF THE INVENTION

The present invention relates to spread spectrum clock generators generally and, more particularly, to a circuit and method for linear control of a spread spectrum transition.

BACKGROUND OF THE INVENTION

Electronic devices must meet maximum electromagnetic interference (EMI) radiation limits as specified by the U.S. FCC and other comparable regulatory agencies in other countries. Since new FCC requirements call for PC motherboards to be able to pass EMI tests "open box," manufacturers will not be able to rely on the shielding provided by the case in meeting EMI requirements.

An EMI suppression-enabled clock IC can reduce the system radiated EMI. The reduction in radiated EMI can result in dramatic cost savings for the system. Conventional techniques for reducing EMI include ground planes, filtering components, shielding, and spread spectrum modulated system clocks.

In the spread spectrum technique, instead of concentrating all of a frequency reference's energy on a single frequency, the energy is spread out by modulating the frequency. The modulation results in the energy being spread over a frequency range, instead of being concentrated on one particular frequency. Since the FCC and other regulatory bodies are concerned with peak emissions, not average emissions, the reduction in peak energy due to spread spectrum modulation will help a product meet FCC requirements.

One type of spread spectrum modulation is center modulation (e.g., +/−). A center modulated clock provides the same system processing performance as for a CPU using a non-modulated clock. However, system designers are concerned about overboosting processors. If a processor designed for a 100 MHz reference is used with a reference that spends most of the time at 100.5 MHz, the processor will be operating at a higher than rated speed during that period of time. To alleviate this concern, modulation can be specified as "down only," e.g., −0.5%. A −0.5% modulation, in the same 100 MHz example, would vary the frequency from 99.5 to 100 MHz. This is achieved by moving the center frequency down. What is specified as "100 MHz, with −0.5% modulation" can really be thought of as "99.75 MHz with +/−0.25% modulation." Using "down only" modulation results in a performance degradation of a CPU, as the nominal 100 MHz signal is now less than 100 MHz.

If the spread spectrum clock generator could be configured for the spread spectrum modulation to be switched on and off, a system could have reduced EMI while still providing top performance when needed. However, during the transition period when the spread spectrum modulation is switching on, the frequency can change faster than the internal clock of the CPU can track. When the slew rate is too high (i.e., the frequency changes too fast), the CPU will lose track of the input clock and hang.

Referring to FIG. 1, a block diagram of a circuit 10 illustrating a conventional phase lock loop based spread spectrum clock generator is shown. The circuit 10 generates a signal OUT in response to (i) a reference signal REF and a command signal SSON. The signal REF is presented to an input prescaler 12 and a multiplexer 14. The signal OUT is presented to a feedback prescaler 20 and a multiplexer 22. The signal SSON is presented to the control inputs 28 and 30 of the multiplexers 14 and 22, respectively and an input 32 of the spread spectrum circuitry 26. In response to the command signal SSON, (i) the multiplexer 14 selects between the reference signal REF and an output of the input prescaler 12, (ii) the multiplexer 22 selects between the output signal OUT and an output of the feedback prescaler 20, and (iii) the spread spectrum circuitry 26 switches on and/or switches off spread spectrum modulation.

Referring to FIG. 2, a numerical simulation and an oscilloscope tracing illustrating the signal OUT are shown. A portion 40a of the numerical simulation and a portion 40b of the oscilloscope tracing illustrate the high slew rate of the transient response of the circuit 10 when spread spectrum modulation is switched on.

SUMMARY OF THE INVENTION

The present invention concerns a spread spectrum clock generator comprising a spread spectrum modulation circuit and a control circuit. The spread spectrum modulation circuit may be configured to generate a clock signal in response to (i) a sequence of linearity ROM codes, (ii) a sequence of spread spectrum ROM codes, and (iii) a command signal. The control circuit may be configured to synchronize the command signal to a feedback signal. The sequence of linearity ROM codes and the sequence of spread spectrum ROM codes may be generated by predetermined mathematical formulas and optimized in accordance with predetermined criteria.

The objects, features and advantages of the present invention include providing a circuit and method for linear control of a spread spectrum transition that may (i) provide a slow rate of frequency change during spread spectrum turn-on and/or (ii) provide a linear control of the frequency change during spread spectrum turn-on.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
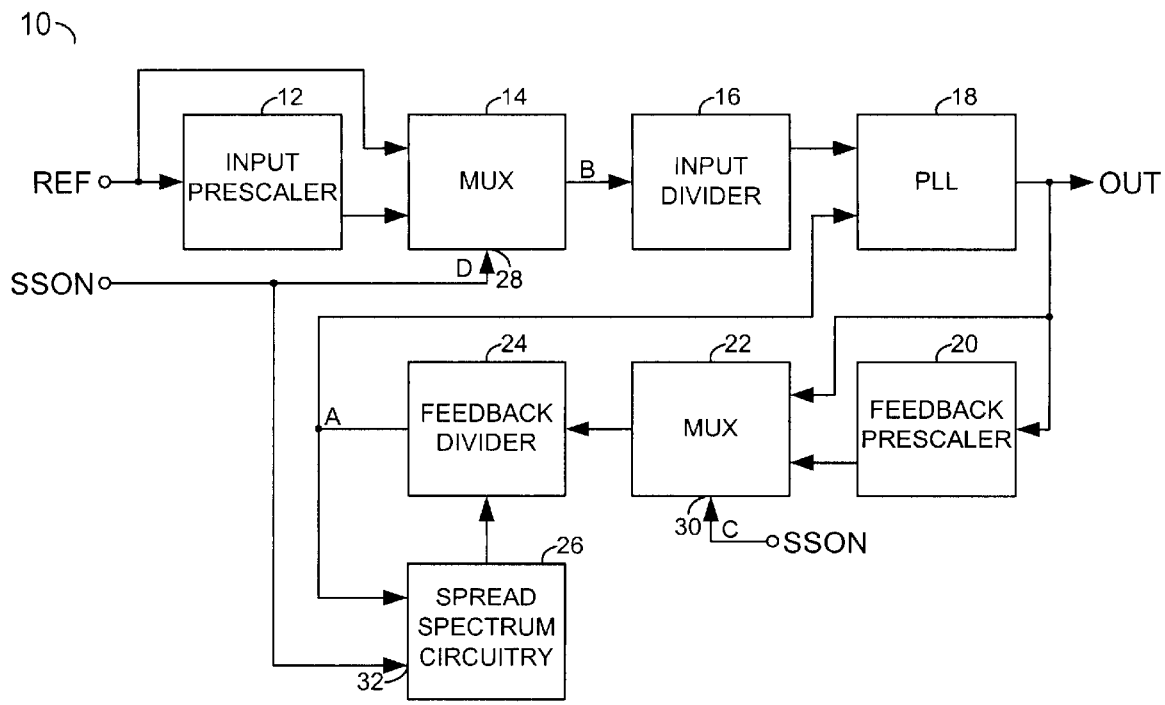
FIG. 1 is a block diagram illustrating a conventional spread spectrum clock generator.
Figure 3:
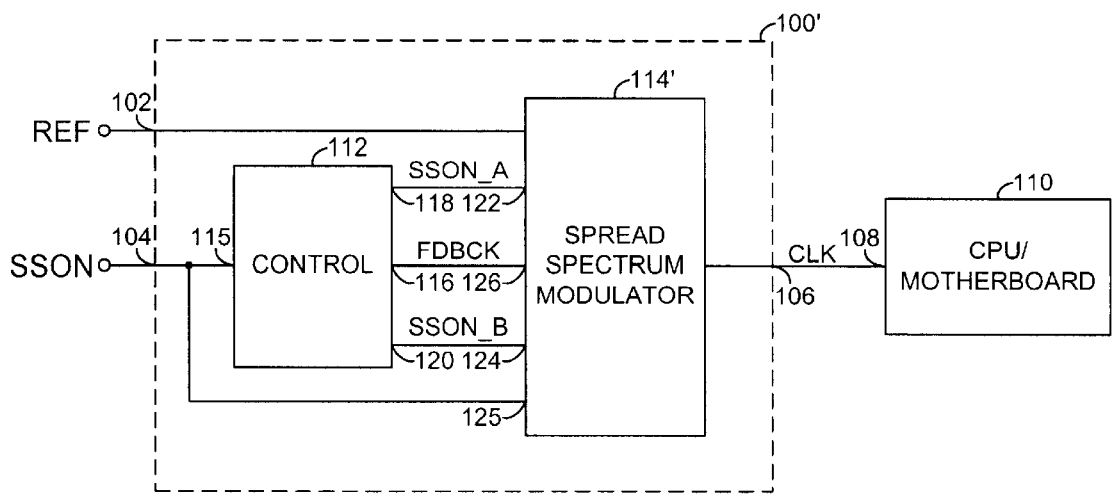
FIG. 3 is a block diagram illustrating a preferred embodiment of the present invention.

Referring to FIG. 3, a block diagram of a circuit 100' is shown in accordance with a preferred embodiment of the present invention. The circuit 100' may be implemented, in one example, as a spread spectrum clock generator circuit having a linear transition when modulation is switched on. The circuit 100' is connected similarly to a circuit 100 that may be found in the co-pending application Ser. No. 09/436, 522, filed concurrently, which is hereby incorporated by reference in its entirety. Elements of the circuit 100' that have corresponding elements in the circuit 100 are similarly numbered. Elements of the circuit 100' that are generally different from the circuit 100 have a primed number.

The circuit 100' may have a clock input 102, a control input 104, and an output 106. A reference signal (e.g., REF) is generally presented to the input 102. A command signal (e.g., SSON) is generally presented to the input 104. The circuit 100' may be configured to generate a clock signal (e.g., CLK) at the output 106 in response to (i) the signal REF and (ii) the signal SSON. When the signal SSON is in a first state (e.g., a logic "0", or LOW), the signal CLK may be an unmodulated clock signal. When the signal SSON is in a second state (e.g., a logic "1", or HIGH), the signal CLK may be a spread spectrum modulated clock signal. The particular polarity of the signal SSON may be changed to meet the design criteria of a particular application.

When the circuit 100' is switching from no modulation to spread spectrum modulation, there will generally be a transition period. The signal CLK, in accordance with the present invention, may have a low slew rate, linear frequency change during the transition period. The signal CLK may be presented, in one example, to a clock input 108 of a CPU/Motherboard (or other device requiring a clock input) 110. Since the clock input 108 may have a maximum slew rate requirement, the circuit 100' may be configured to generate the signal CLK in accordance with the particular slew rate requirement. The circuit 100' may have a circuit 112 and a circuit 114'. The circuit 112 may be implemented, in one example, as a control circuit. The circuit 114' may be implemented, in one example, as a spread spectrum modulation circuit.

Figure 4:
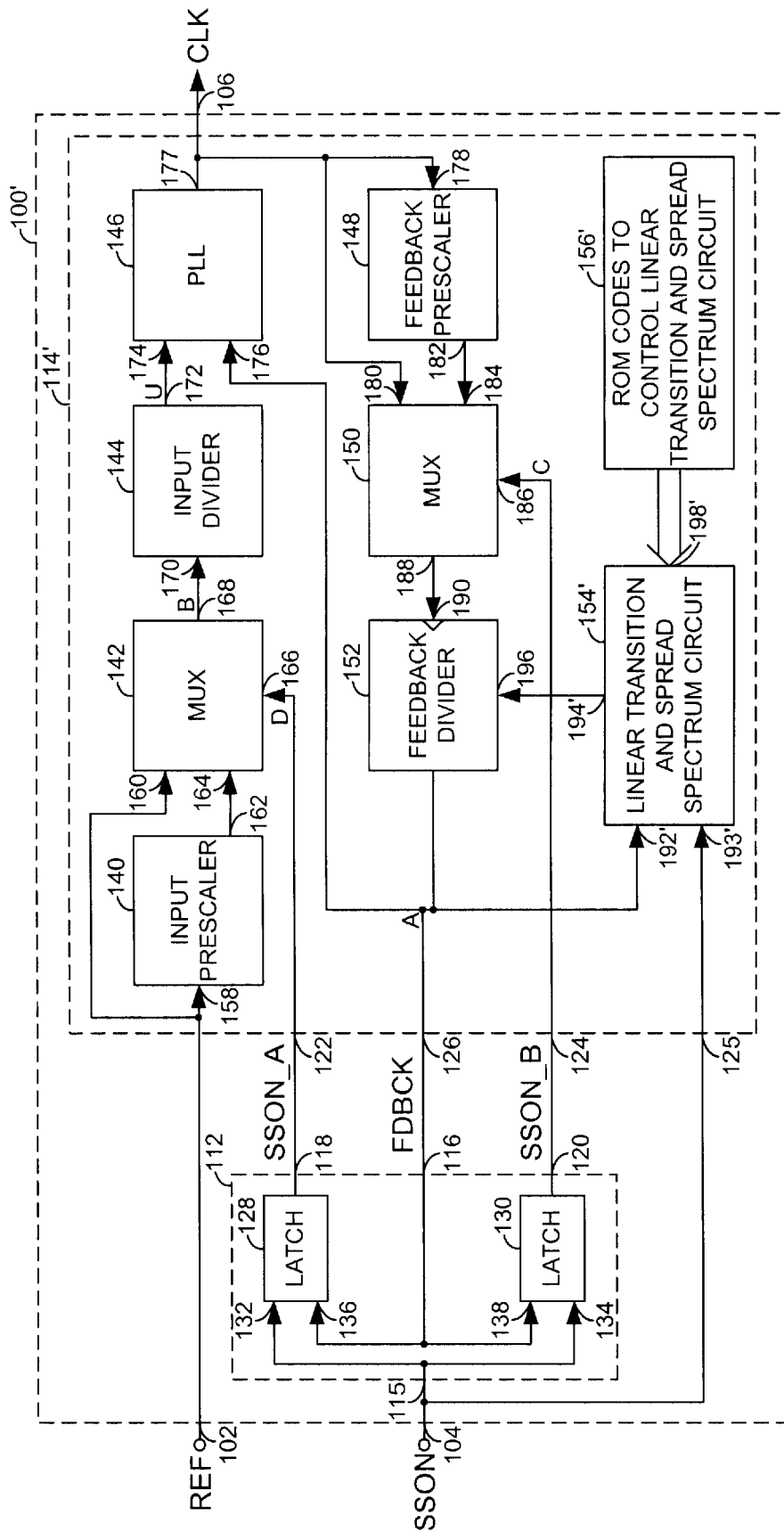
FIG. 4 is a more detailed block diagram illustrating a preferred embodiment.

Referring to FIG. 4, a more detailed block diagram of the circuit 100' is shown. The circuit 100' differs from the circuit 100 in that the circuit 114' may have a circuit 154' and a ROM 156'. The circuit 154' may be implemented, in one example, as a linear transition and spread spectrum circuit. The ROM 156' may contain, in one example, a sequence of linearity ROM codes and a sequence of spread spectrum ROM codes. The ROM codes of the ROM 156' may be used, in one example, by the circuit 154' to control a feedback divider 152. By controlling the feedback divider 152, the circuit 154' will generally control the signal CLK. In one example, when the circuit 154' sets the feedback divider 152 using a single ROM code, the circuit 100' may generate the signal CLK with no modulation. When the circuit 154' controls the feedback divider 152 using the sequence of linearity ROM codes, the circuit 100' may generate the signal CLK having a low slew rate, linear frequency change. When the circuit 154' control the feedback divider 152 using the sequence of spread spectrum ROM codes, the circuit 100' may generate the signal CLK with spread spectrum modulation.

The sequence of linearity ROM codes contained in the ROM 156' may be generated by using one or more predetermined mathematical formulas. In one example, the following equation may be used (the variables are described in more detail in connection with FIG. 6 below):

$$fideal(t) = foff - \frac{foff - fmax}{Ttotal} \cdot (t - ti)$$

However, other equations may be used to meet the design criteria of a particular application. The generated sequence of linearity ROM codes may be optimized for a particular application. To optimize the generated sequence of linearity ROM codes, another predetermined mathematical formula may be used. In one example, a least square error method may be applied to the sequence of linearity ROM codes using the following equation (the variables are described in more detail in connection with FIG. 6 below):

$$Min\left\{\frac{\int_{i}^{i+1}[fideal(t) - f(t)]^2 \, dt}{Ttotal}\right\}$$

The mathematical formulas above are generally used to generate the sequence of linearity ROM codes. The sequence of spread spectrum ROM codes may be generated according to a process that may be found in the co-pending application Ser. No. 09/436,522, filed concurrently, which is hereby incorporated by reference in its entirety.

Figure 2:
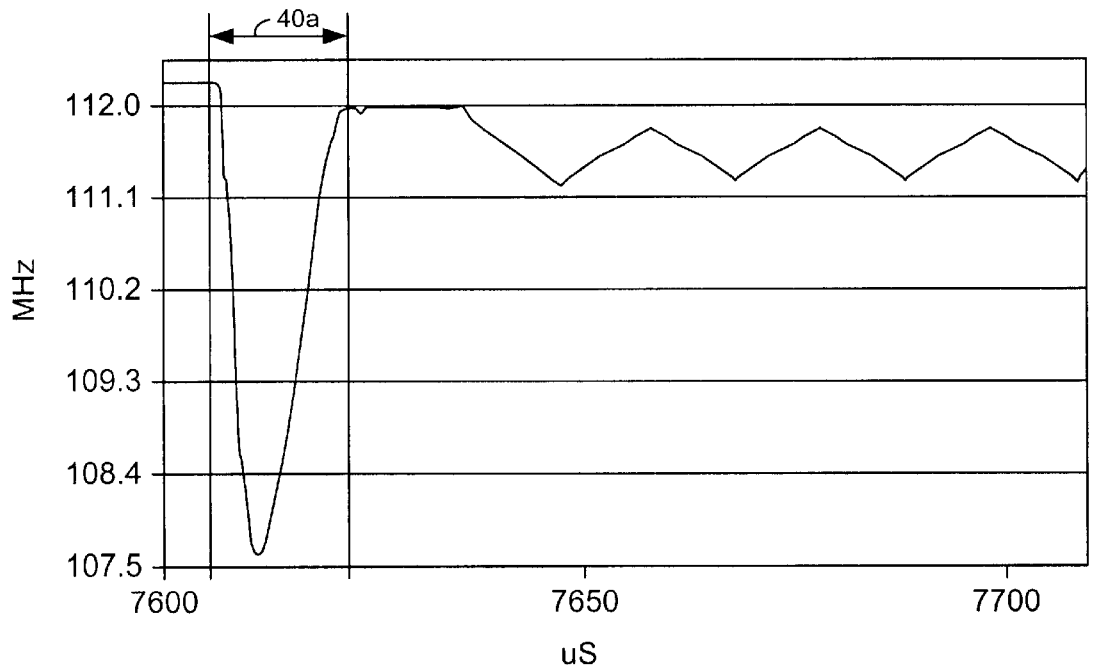
FIG. 2 is a numerical simulation and an oscilloscope tracing illustrating an output signal of the circuit of FIG. 1.
Figure 2:
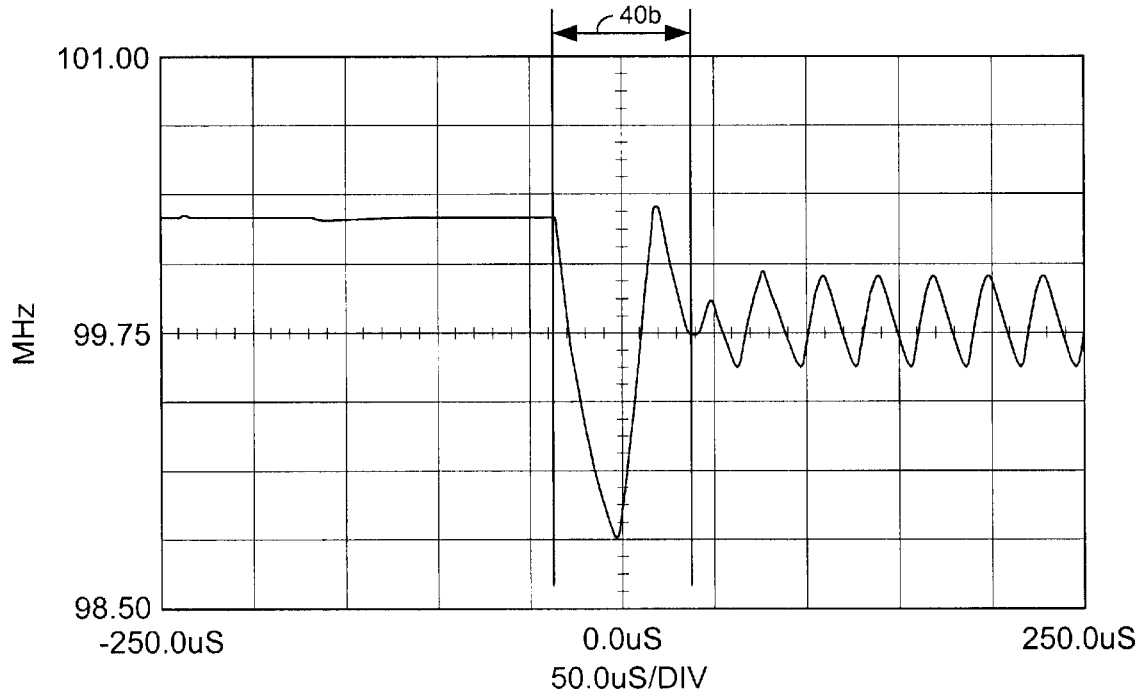
Figure 5:
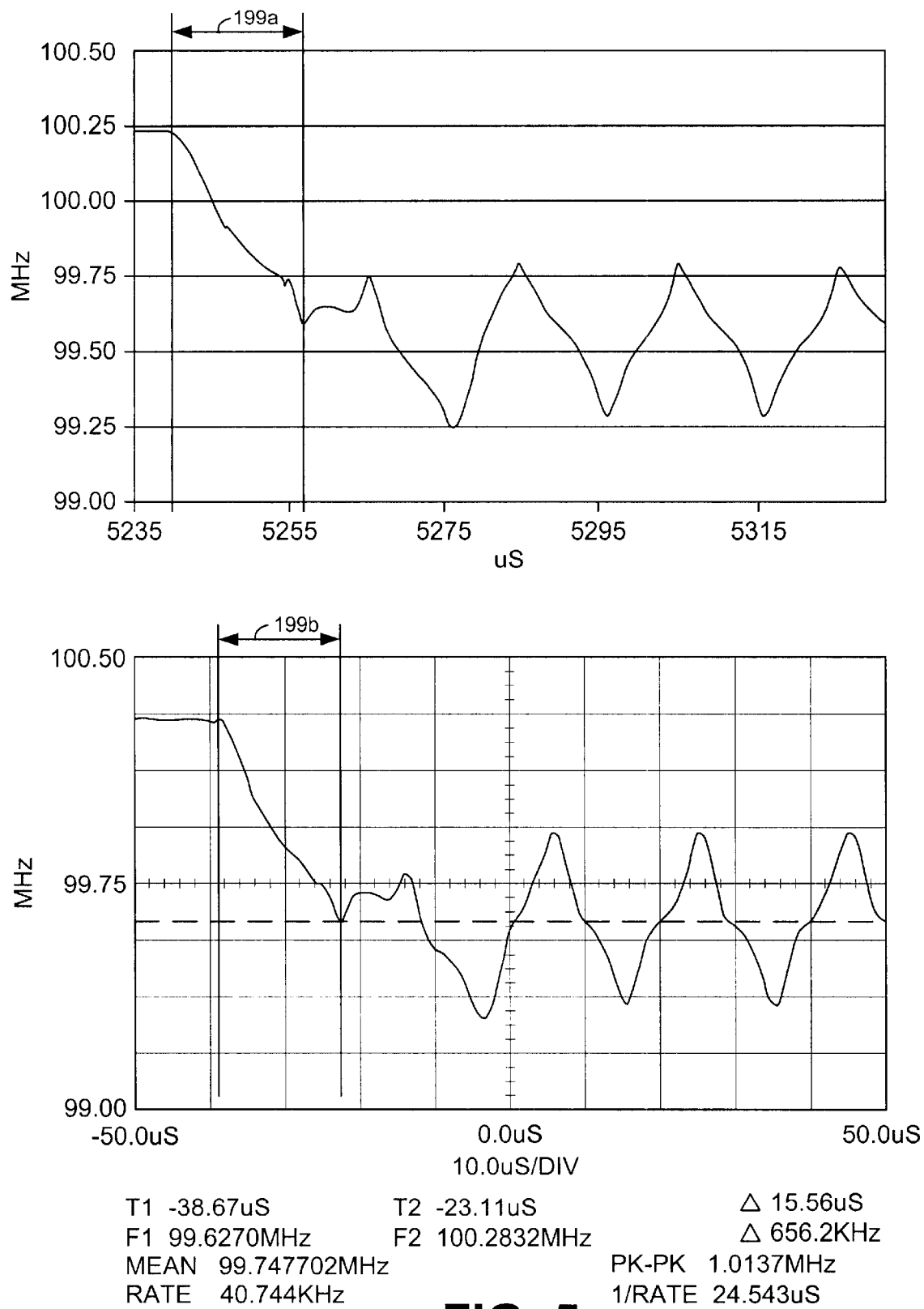
FIG. 5 is a signal diagram illustrating an output signal of the circuit of FIG. 3.

Referring to FIG. 5, a numerical simulation and an oscilloscope tracing illustrating the signal CLK is shown. A portion 199a of the numerical simulation and a portion 199b of the oscilloscope tracing illustrate the response of the circuit 100' during a spread spectrum transition. A comparison between the portions 199a and 199b of the signal CLK and the portions 40a and 40b of the signal OUT, shown in FIG. 2, reveals the linear aspect and lower slew rate of the signal CLK.

Figure 6:
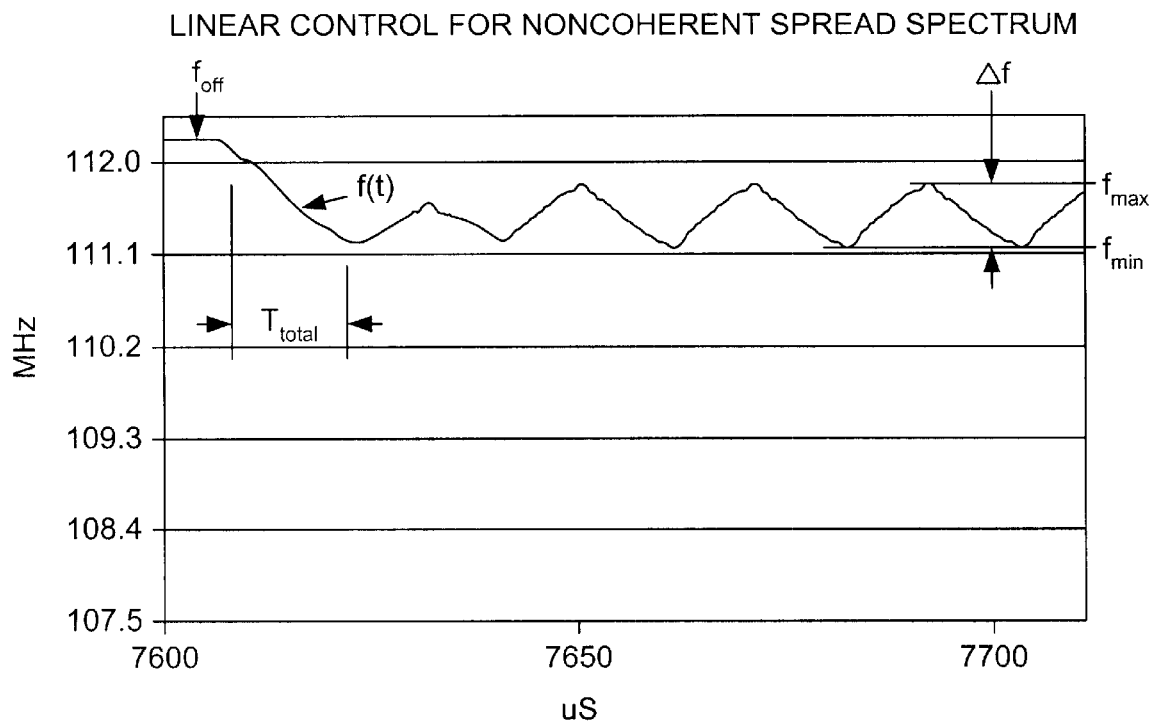
FIG. 6 is a diagram illustrating criteria used in determining when a sequence of linearity ROM codes may be optimized.

Referring to FIG. 6, a diagram illustrating an example of the criteria for determining whether spread spectrum transient behavior is good (e.g., within acceptable or predetermined tolerances) or bad (e.g., not within acceptable or predetermined tolerances) is shown. A value foff is generally the unmodulated frequency of the signal CLK. A value fmax is generally the maximum frequency of the signal CLK when spread spectrum modulation is on. A value fmin is generally the minimum frequency of the signal CLK when spread spectrum modulation is on. A value Δf generally represents the peak to peak frequency range of the signal CLK when spread spectrum modulation is on. A function f(t) generally represents the changes in the frequency of the signal CLK during the transition time period. A value Ttotal generally represents the total time of the transition period. The sequence of the spread spectrum ROM codes is generally considered optimized when (i) the function f(t) is greater than or substantially equal to the value (fmin −0.5 Δf) and less than or substantially equal to the value foff and (ii) the magnitude of the slew rate of the signal CLK is generally less than 60 kHz per microsecond.

Figure 7:
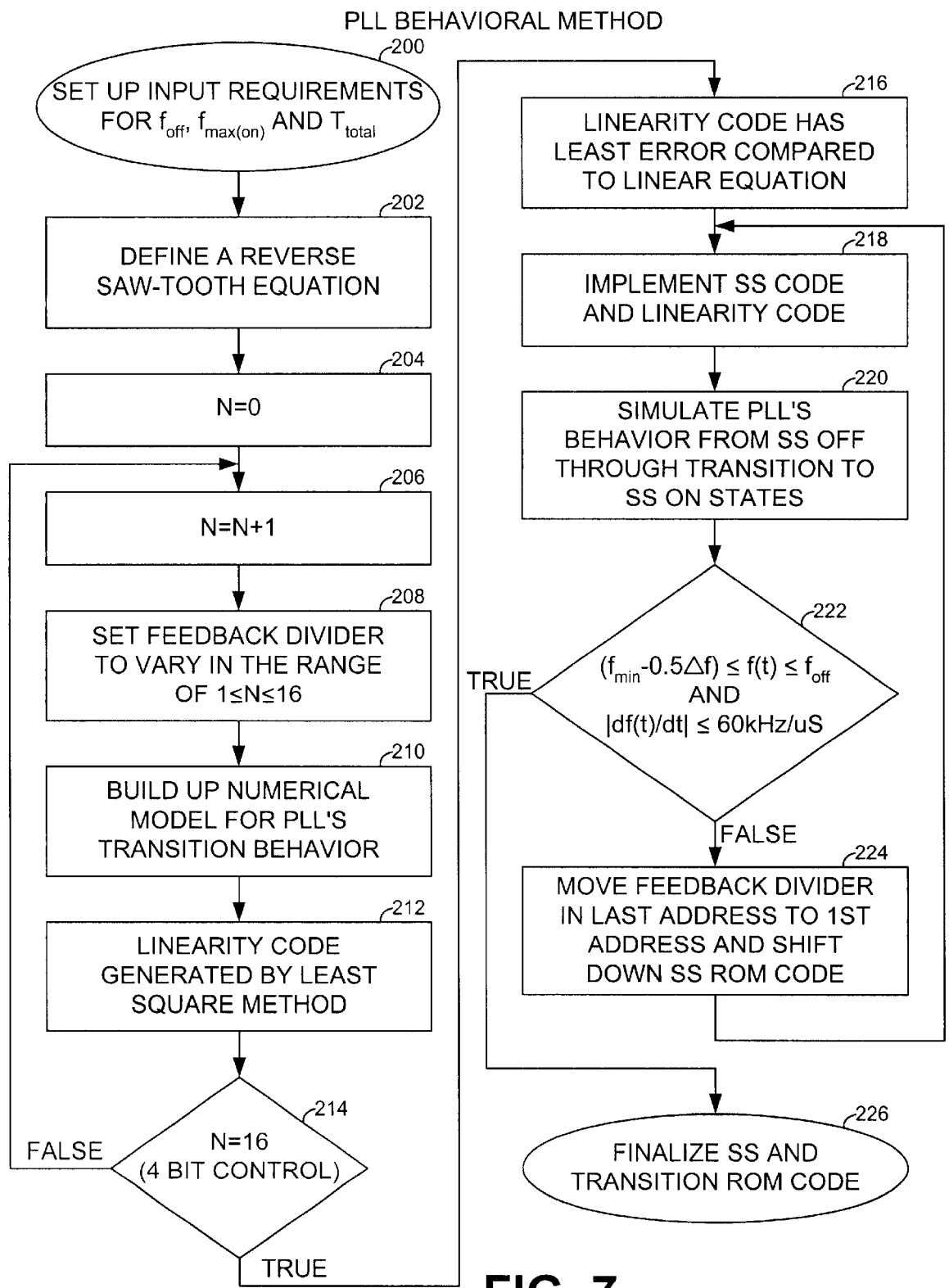
FIG. 7 is a flow chart illustrating a process for optimizing a sequence of linearity ROM codes and spread spectrum ROM codes in accordance with a preferred embodiment of the present invention.

Referring to FIG. 7, a flow chart illustrating a process for generating the sequence of linearity ROM codes and optimizing the sequence of spread spectrum ROM codes is shown. The process may be performed, in one example, using one or more computer programs to (i) generate the sequence of ROM codes, (ii) simulate the operation of the circuit 100', and/or (iii) shift the spread spectrum ROM codes until the predetermined criteria are met.

The first step is generally to determine the parameters of an acceptable linear transition (e.g., block 200). A reverse saw-tooth may be defined using a predetermined mathematical equation (e.g., block 202). In one example, the following equation may be used to define the reverse saw-tooth:

$$fideal(t) = foff - \frac{foff - fmax}{Ttotal} \cdot (t - ti)$$

The value ti is the time point when spread spectrum modulation is switched on. The value t is the current time point in the transition period Ttotal.

The transition period may be generally divided into a number of intervals (e.g., I). The sequence of linearity ROM codes may contain I codes. The feedback divider 152 may have a predetermined number of values (e.g., N). In one example, N may be 16 allowing for 4-bit control of the linear transition. The sequence of linearity ROM codes may be generated by trying each value of the feedback divider 152 at each time point in the transition period. The values that generally give the best fit to the ideal function fideal(t) are generally chosen as the ROM codes. In the example where N is 16, a counter is started at N=0 (e.g., block 204). The counter is incremented by one (e.g., block 206). The feedback divide 152 is set to vary through the sixteen possible values (e.g., block 208). A numerical model of the transient behavior of the circuit 100' is generally produced (e.g., block 210). The linearity ROM code may be generated by a least square method (e.g., block 212). In one example, the linearity ROM code may be generated using the following formula:

$$\text{Min}\left\{ \frac{\int_i^{i+1} [fideal(t) - f(t)]^2 \, dt}{Ttotal} \right\}$$

If all of the ROM codes have not been generated, the iterative process generally continues (e.g., block 214). Otherwise, the process generally continues with the linearity ROM codes having been finalized (e.g., the codes have the least error compared to the reverse saw-tooth, block 216).

The linearity ROM codes are generally loaded, with predetermined spread spectrum ROM codes, into a simulation program for the circuit 100' (e.g., block 218). The transient behavior of the circuit 100' is generally simulated (i) from a state where the spread spectrum modulation is OFF, (ii) through the transition period, and (iii) to a state where the spread spectrum modulation is ON (e.g., block 220). If the behavior of the circuit 100' during the transition period was good (e.g., within acceptable design tolerances, block 222), the linearity ROM codes and the spread spectrum ROM codes are generally finalized (e.g., block 226). If the behavior of the circuit 100' during the transition period was bad (e.g., not within acceptable design tolerances, block 222), (i) the last value in the sequence of spread spectrum ROM codes is generally moved to the first position in the sequence of spread spectrum ROM codes (e.g., block 224), (ii) the rest of the spread spectrum ROM codes are generally shifted down one position (e.g., block 224), and (iii) the process is generally reiterated starting with block 218.

In one example, acceptable design tolerances may be defined as (i) the signal CLK having a frequency greater than or substantially equal to (fmin −0.5 ΔF) and less than or substantially equal to foff and (ii) the slew rate of the signal CLK (e.g., df(t)/dt) having a magnitude less than or substantially equal to 60 KHz per microsecond. However, other design tolerances may be implemented accordingly to meet the design criteria of a particular implementation.

Figure 8:
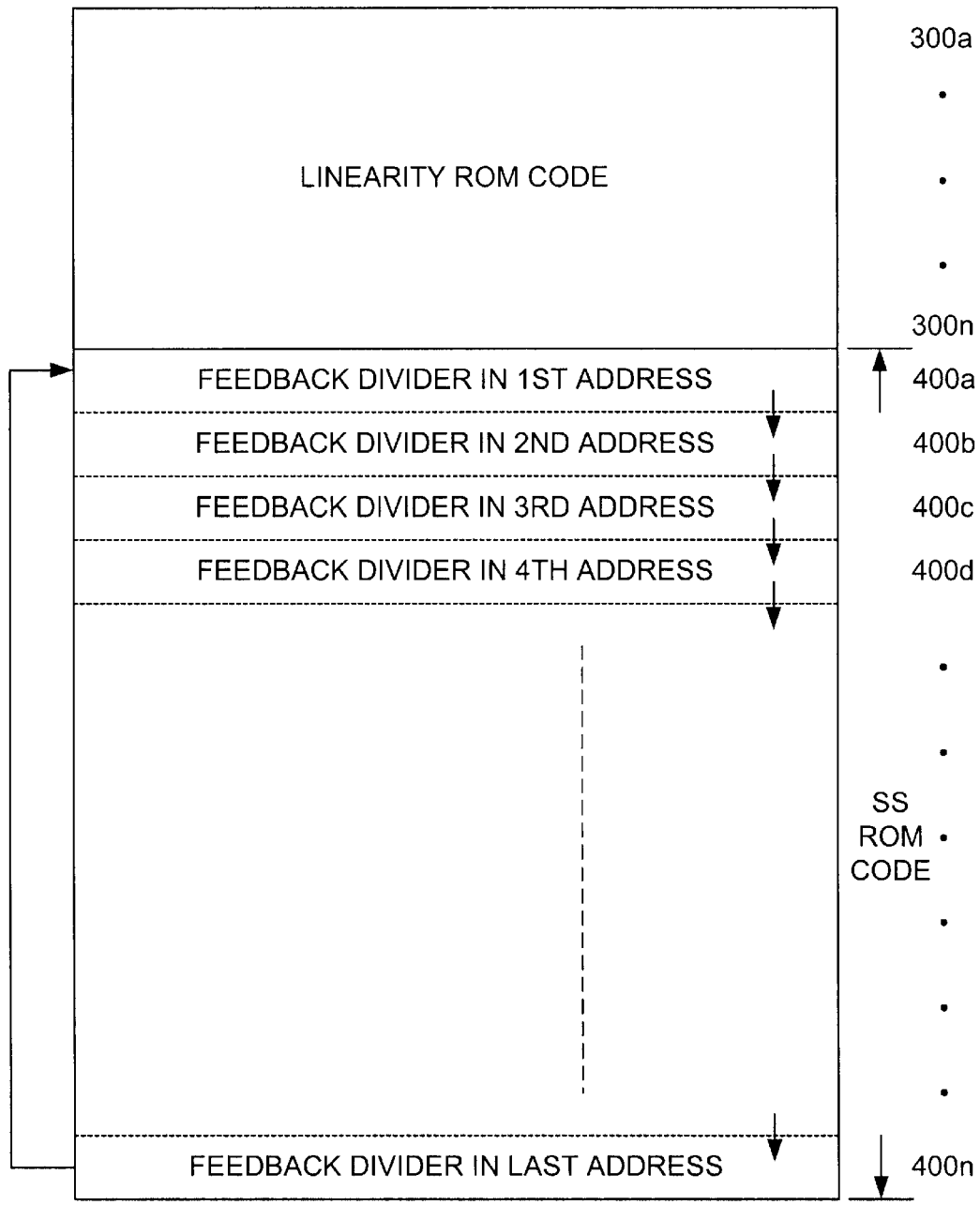
FIG. 8 is a more detailed diagram illustrating the optimization of a sequence of spread spectrum ROM codes in relation to a sequence of linearity ROM codes.

Referring to FIG. 8, a more detailed block diagram of the ROM 156' is shown illustrating the process of shifting the spread spectrum ROM code, as mentioned in the block 224 of FIG. 7. In one example, the ROM 156' may contain two sequences of codes. The first sequence is generally the linearity ROM codes 300a–300n. The second sequence is generally the spread spectrum ROM codes 400a–400n. If the predetermined criteria for the transient response of the circuit 100' have not been met, the feedback divider value in the last address location within the spread spectrum ROM codes 400n is generally moved to the first address location within the spread spectrum ROM codes 400a. All other values of spread spectrum ROM codes 400a–400(n−1) are generally shifted forward one address location. The sequence of linearity ROM codes is generally left untouched.

While the invention has been particularly shown and described with reference to the preferred embodiments thereof, it will be understood by those skilled in the art that various changes in form and details may be made without departing from the spirit and scope of the invention.

What is claimed is:

1. A spread spectrum clock generator comprising:
    a spread spectrum modulation circuit configured to generate a clock signal in response to (i) a sequence of linearity ROM codes, (ii) a sequence of spread spectrum ROM codes, and (iii) a command signal; and
    a control circuit configured to synchronize said command signal to a feedback signal, wherein said sequence of linearity ROM codes and said sequence of spread spectrum ROM codes are generated according to one or more predetermined mathematical formulas and optimized in accordance with predetermined criteria.

2. The spread spectrum clock generator according to claim 1, wherein said spread spectrum modulation circuit modulates said clock signal.

3. The spread spectrum clock generator according to claim 2, wherein said modulation of said clock signal can be switched on and/or off in response to said command signal.

4. The spread spectrum clock generator according to claim 1, wherein said spread spectrum clock generator is implemented on a motherboard or CPU.

5. The spread spectrum clock generator according to claim 1, wherein said control circuit is further configured to generate one or more control signals in response to (i) said command signal and (ii) said feedback signal.

6. The spread spectrum clock generator according to claim 5, wherein said control circuit comprises a first latch.

7. The spread spectrum clock generator according to claim 6, wherein said control circuit further comprises a second latch.

8. The spread spectrum clock generator according to claim 3, wherein said predetermined criteria are applied to said clock signal during a transition period when modulation is switching on.

9. The spread spectrum clock generator according to claim 1, wherein said predetermined criteria includes a predetermined maximum slew rate for said clock signal.

10. The spread spectrum clock generator according to claim 7, wherein said predetermined mathematical formulas comprise:

$$fideal(t) = foff - \frac{foff - fmax}{Ttotal} \cdot (t - ti).$$

wherein (i) fideal(t) comprises an ideal function, (ii) foff comprises an unmodulated frequency of said clock signal, (iii) fmax comprises a maximum frequency of said clock signal, (iv) Ttotal comprises a total time of a transition period, (v) t comprises a current time point in said transition period Ttotal, and (vi) ti comprises a time point when said spread spectrum is on.

11. The spread spectrum clock generator according to claim 10, wherein said predetermined mathematical formulas further comprise:

$$\mathrm{Min}\left\{\frac{\int_{i}^{i+1}[fideal(t)-f(t)]^{2}\,dt}{Ttotal}\right\}.$$

wherein f(t) comprises a change in frequency of the signal clock.

12. The spread spectrum clock generator according to claim 1, wherein:
said sequence of linearity ROM codes is optimized using a computer program to simulate transient behavior of said spread spectrum clock generator.

13. A spread spectrum clock generator comprising:
means for generating a clock signal in response to (i) a sequence of linearity ROM codes, (ii) a sequence of spread spectrum ROM codes, and (iii) a command signal; and
means for synchronizing said command signal to a feedback signal, wherein said sequence of linearity ROM codes and said sequence of spread spectrum ROM codes are generated according to one or more predetermined mathematical formulas and optimized in accordance with predetermined criteria.

14. A method of producing a low slew rate linear transition in the turn-on transient response of a spread spectrum clock generator comprising the steps of:
(A) generating a sequence of linearity ROM codes according to a predetermined mathematical formula;
(B) optimizing said sequence of linearity ROM codes according to one or more predetermined criteria; and
(C) modulating a clock signal in response to (i) said sequence of linearity ROM codes and (ii) a command signal.

15. The method according to claim 14, wherein the step of generating said sequence of linearity ROM codes further comprises the sub-steps of:
(A) selecting a number of ROM codes to be used to generate a linear frequency transition; and
(B) generating said number of ROM codes according to said predetermined mathematical formulas.

16. The method according to claim 15, wherein the step (B) further comprises the sub-steps of:
(B-1) setting operating parameters;
(B-2) defining a reverse saw-tooth equation using said operating parameters;
(B-3) building a numerical model of said turn-on transient response of said spread spectrum clock generator;
(B-4) using a least square error method to optimize said sequence of linearity ROM codes.

17. The method according to claim 16, wherein said sub-steps are performed by a computer program.

18. The method according to claim 14, wherein said step (C) further comprises the sub-step of controlling a feedback divider with said sequence of linearity ROM codes and a sequence of spread spectrum ROM codes.

19. The method according to claim 14, further comprising the step of (D) synchronizing said command signal to said feedback signal.

20. The method according to claim 19, wherein the step (D) is performed using one or more latches.

* * * * *